(12) United States Patent
Cheng et al.

(10) Patent No.: US 11,456,732 B2
(45) Date of Patent: Sep. 27, 2022

(54) METHOD AND APPARATUS FOR RC/CR PHASE ERROR CALIBRATION OF MEASUREMENT RECEIVER

(71) Applicant: FUTUREWEI TECHNOLOGIES, INC., Plano, TX (US)

(72) Inventors: Zhenguo Cheng, Superior, CO (US); Xuya Qiu, Summerfield, NC (US)

(73) Assignee: FUTUREWEI TECHNOLOGIES, INC., Addison, TX (US)

( * ) Notice: Subject to any disclaimer, the term of this patent is extended or adjusted under 35 U.S.C. 154(b) by 0 days.

(21) Appl. No.: 17/202,289

(22) Filed: Mar. 15, 2021

(65) Prior Publication Data

US 2021/0203315 A1    Jul. 1, 2021

Related U.S. Application Data

(63) Continuation of application No. 16/041,118, filed on Jul. 20, 2018, now Pat. No. 10,951,202.

(51) Int. Cl.
*H03K 5/13* (2014.01)
*H04B 1/16* (2006.01)
(Continued)

(52) U.S. Cl.
CPC ............. *H03K 5/13* (2013.01); *H03K 17/687* (2013.01); *H04B 1/16* (2013.01); *H03K 2005/00286* (2013.01)

(58) Field of Classification Search
CPC ........... H03K 5/13; H03K 17/687; H04B 1/16
(Continued)

(56) References Cited

U.S. PATENT DOCUMENTS 4,908,532 A * 3/1990 Chadwick ............ G05B 19/406
                                                327/236
5,644,260 A * 7/1997 DaSilva ................... H03C 1/52
                                                327/238
(Continued)

FOREIGN PATENT DOCUMENTS

CN        1679231 A    10/2005
CN      103840768 A     6/2014

OTHER PUBLICATIONS

Andrzej Szymanski et al., The self-calibration method of IR mixer with low IF, Analog Integr Circ Sig Process (2008) 55:115-124, Mar. 25, 2008, 10 pages. (Year: 2008).*
(Continued)

*Primary Examiner* — Ryan Jager
(74) *Attorney, Agent, or Firm* — James Anderson Harrison (57) ABSTRACT

A circuit includes a RC-CR circuit and a second circuit. The RC-CR circuit outputs a first signal at a first output node over a RC path, and a second signal at a second output node over a CR path. The second circuit is coupled to the RC-CR circuit at the first output node over the RC path. The second circuit includes an array of capacitors coupled in parallel and a plurality of switches, and each of the array of capacitors is connected, in series, to a corresponding switch in the plurality of switches. Each of the array of capacitors and its corresponding switch are coupled between the first output node and a ground. The plurality of switches is switched on or off such that the first signal and the second signal have a phase difference that falls within a predetermined phase range.

10 Claims, 6 Drawing Sheets

(51) Int. Cl.
*H03K 17/687* (2006.01)
*H03K 5/00* (2006.01)

(58) Field of Classification Search
USPC ........................................................ 327/250
See application file for complete search history.

(56) References Cited

U.S. PATENT DOCUMENTS

| | | | | |
|---|---|---|---|---|
| 6,172,543 | B1* | 1/2001 | Kurisu | H03H 11/22 327/255 |
| 6,211,708 | B1* | 4/2001 | Klemmer | H03B 21/01 327/122 |
| 6,310,502 | B1* | 10/2001 | Klier | H03H 11/22 327/231 |
| 6,313,680 | B1* | 11/2001 | Havens | H03H 11/22 327/236 |
| 6,369,622 | B1* | 4/2002 | Lim | H03B 19/14 327/116 |
| 6,369,633 | B1* | 4/2002 | Tsukahara | H03B 27/00 327/254 |
| 6,815,993 | B1* | 11/2004 | Ishimoto | H03H 7/21 327/247 |
| 6,980,787 | B1* | 12/2005 | Dujmenovic | H03D 3/007 455/302 |
| 6,982,584 | B2* | 1/2006 | Melly | H03B 27/00 327/238 |
| 7,079,823 | B1* | 7/2006 | Morche | H03D 7/166 327/254 |
| 7,282,979 | B2* | 10/2007 | Tanaka | H03H 7/20 327/231 |
| 7,643,809 | B1 | 1/2010 | Meacham | |
| 8,269,543 | B2* | 9/2012 | Teetzel | H03H 11/22 327/254 |
| 8,872,569 | B2* | 10/2014 | Garrison | H03H 11/20 327/328 |
| 9,246,736 | B2* | 1/2016 | Sorrells | H04B 7/12 |
| 2002/0003444 | A1* | 1/2002 | Sasaki | H03H 7/21 327/244 |
| 2004/0196084 | A1* | 10/2004 | Melly | H03B 27/00 327/238 |
| 2006/0209987 | A1 | 9/2006 | Miyagi et al. | |
| 2007/0242779 | A1* | 10/2007 | Choi | H04B 1/30 375/332 |
| 2008/0100398 | A1 | 5/2008 | Afsahi et al. | |
| 2008/0137777 | A1* | 6/2008 | Behzad | H04L 27/362 375/319 |
| 2008/0137785 | A1* | 6/2008 | Li | H03D 3/009 375/346 |
| 2008/0139115 | A1* | 6/2008 | Roufoogaran | H04B 1/0082 455/41.1 |
| 2008/0139154 | A1* | 6/2008 | Behzad | H04B 7/0811 455/277.2 |
| 2014/0139279 | A1* | 5/2014 | Garrison | H03H 11/20 327/238 |
| 2015/0304155 | A1* | 10/2015 | Lin | H04B 1/123 375/345 |
| 2015/0349821 | A1 | 12/2015 | Rai et al. | |
| 2017/0214409 | A1* | 7/2017 | Kondo | H04B 1/38 |
| 2017/0250574 | A1* | 8/2017 | Min | H02J 50/12 |
| 2017/0288461 | A1* | 10/2017 | Konanur | H04B 5/0037 |
| 2018/0131267 | A1* | 5/2018 | Limjoco | H02M 1/143 |
| 2019/0013794 | A1* | 1/2019 | Kato | H03H 11/22 |

OTHER PUBLICATIONS

Andrzej Szymanski et al, The self-calibration method of IR mixer with low IF, Analog Integr Circ Sig Process (2008) 55:115-124, Mar. 25, 2008, 10 pages.

* cited by examiner

METHOD AND APPARATUS FOR RC/CR PHASE ERROR CALIBRATION OF MEASUREMENT RECEIVER

CROSS-REFERENCE TO RELATED APPLICATIONS

The present application incorporates by reference and claims priority to co-pending non-provisional application having U.S. patent application Ser. No. 16/041,118, filed on Jul. 20, 2018 under 35 U.S.C. 120, 121, 365(c), or 386(c).

TECHNICAL FIELD

The present disclosure relates generally to wireless communications, and in particular embodiments, to techniques and mechanisms for RC/CR phase error calibration of a measurement receiver.

BACKGROUND

Measurement receivers have been widely used for measuring characteristics of radio signals, and the measured characteristics may be used for calibration of radio signals and processing methods in a wireless communication system.

SUMMARY OF THE INVENTION

Technical advantages are generally achieved, by embodiments of this disclosure which describe a method and apparatus for RC/CR phase error calibration of a measurement receiver.

According to one aspect of the present disclosure, there is provided a circuit that includes: a RC-CR circuit, configured to phase-shift an input signal received at an input node of the RC-CR circuit, wherein the RC-CR circuit has a first output node outputting a first output signal over a first output path, and the RC-CR circuit has a second output node outputting a second output signal over a second output path; and a first circuit coupled to the RC-CR circuit at the first output node over the first output path, wherein the first circuit comprises an array of capacitors coupled in parallel and a plurality of switches, a first terminal of each of the array of capacitors is coupled to the first output node of the RC-CR circuit, and a second terminal of each of the array of capacitors is coupled to a ground of the circuit through a corresponding switch in the plurality of switches, wherein each of the plurality of switches is controllable to be switched on or switched off such that the first output signal and the second output signal of the RC-CR circuit has a phase difference that falls within a predetermined phase range.

Optionally, in any of the preceding aspects, each of the array of capacitors has a capacitance that is equal to a same capacitance value weighted by a predetermined weighting factor.

Optionally, in any of the preceding aspects, the RC-CR circuit further comprises: a first resistor having a first terminal coupled to the ground of the circuit through a first capacitor in series, and a second terminal coupled to the input node of the RC-CR circuit, wherein a common node of the first resistor and the first capacitor is coupled to the first output node of the RC-CR circuit; and a second capacitor having a first terminal coupled to the ground of the circuit through a second resistor in series, and a second terminal coupled to the input node of the RC-CR circuit, wherein a common node of the second resistor and the second capacitor is coupled to the second output node of the RC-CR circuit; and wherein each of the first resistor and the second resistor has a fixed resistance, and each of the first capacitor and the second capacitor has a fixed capacitance.

Optionally, in any of the preceding aspects, the first capacitor and the second capacitor in the RC-CR circuit have a same capacitance.

Optionally, in any of the preceding aspects, first capacitor and the second capacitor in the RC-CR circuit have different capacitances.

Optionally, in any of the preceding aspects, a capacitor in the array of capacitors has a capacitance that is a predetermined fraction of a capacitance of the first capacitor or the second capacitor in the RC-CR circuit.

Optionally, in any of the preceding aspects, the predetermined fraction is 5%, 10%, or 20%.

Optionally, in any of the preceding aspects, the first capacitor has a capacitance that is a fraction of a capacitance of the second capacitor.

Optionally, in any of the preceding aspects, a capacitor in the array of capacitors has a capacitance that is the same as that of the first capacitor in the RC-CR circuit.

Optionally, in any of the preceding aspects, the array of capacitors comprises n capacitors, and an $i^{th}$ capacitor in the n capacitors has a capacitance of $(2i-1*Cs)$, wherein $i=1, 2, \ldots, n$, Cs is a capacitance value, and n and i are integers greater than 0, respectively.

Optionally, in any of the preceding aspects, the circuit further includes: a first buffer coupled to the first output node of the RC-CR circuit, the first buffer receiving the first output signal; a second buffer coupled to the second output node of the RC-CR circuit, the second buffer receiving the second output signal; and a mixer configured to receive output signals from the first buffer and the second buffer.

Optionally, in any of the preceding aspects, the plurality of switches comprises an n-channel metal-oxide-semiconductor field-effect transistor (NMOS) switch.

Optionally, in any of the preceding aspects, the input signal of the RC-CR circuit has a frequency in a range from 660 MHz to 6 GHz.

According to another aspect of the present disclosure, there is provided a mobile device that includes: a first circuit, configured to phase-shift an input signal received at an input node of the first circuit, wherein the first circuit has a first output node outputting a first output signal over a first output path, and the first circuit has a second output node outputting a second output signal over a second output path; and a second circuit coupled to the first circuit at the first output node over the first output path, wherein the second circuit comprises an array of capacitors coupled in parallel and a plurality of switches, each of the array of capacitors is connected, in series, to a corresponding switch in the plurality of switches, and each of the array of capacitors and its corresponding switch are coupled between the first output node of the first circuit and a ground, wherein each of the plurality of switches is controllable to be switched on or switched off such that the first output signal and the second output signal of the first circuit have a phase difference that falls within a predetermined phase range.

Optionally, in any of the preceding aspects, the first circuit further includes: a first resistor connected to a first capacitor in series, the first resistor and the first capacitor being coupled between the input node of the first circuit and the ground, wherein a common node of the first resistor and the first capacitor is coupled to the first output node of the first circuit; and a second capacitor connected to a second resistor in series, the second capacitor and the second resistor are coupled between the input node of the first circuit and the ground, wherein a common node of the second resistor and the second capacitor is coupled to the second output node of the first circuit; and wherein each of the first resistor and the second resistor has a fixed resistance, and each of the first capacitor and the second capacitor has a fixed capacitance.

Optionally, in any of the preceding aspects, a capacitance of a capacitor in the array of capacitors is a predetermined fraction of a capacitance of the first capacitor or the second capacitor in the first circuit.

Optionally, in any of the preceding aspects, the predetermined fraction is 5%, 10%, or 20%.

Optionally, in any of the preceding aspects, the array of capacitors comprises n capacitors, and an $i^{th}$ capacitor in the n capacitors has a capacitance of $(2i-1*Cs)$, wherein $i=1, 2, \ldots, n$, Cs is a capacitance value, and n and i are integers greater than 0, respectively.

Optionally, in any of the preceding aspects, each capacitor in the array of capacitors has a capacitance that is equal to a same capacitance value weighted by a predetermined weighting factor.

According to another aspect of the present disclosure, there is provided a method that includes: determining a phase difference between a first signal and a second signal that are output by a RC-CR circuit, the RC-CR circuit being configured to phase-shift an input signal of the RC-CR circuit, output the first signal at a first output node of the RC-CR circuit and output the second signal at a second output node of the RC-CR circuit; and switching on or off one or more of a plurality of switches in a circuit that is connected to the RC-CR circuit, such that the phase difference falls within a predetermined phase range, the circuit being connected to the RC-CR circuit at the first output node of the RC-CR circuit and comprising a plurality of capacitors and a plurality of switches, wherein the plurality of capacitors are coupled in parallel, each of the plurality of capacitors is coupled to a corresponding switch in the plurality of switches in series, and each of the plurality of capacitors and its corresponding switch are coupled between the first output node of the RC-CR circuit and a ground.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

A RC-CR circuit outputs a first signal at a first output node and outputs a second signal at a second output node. The first signal and the second signal have a phase difference equal to a predetermined phase, e.g., 90°, or falling within a predetermined phase range. However, the phase different may, in many cases, deviate from the predetermined phase or fall out of the predetermined phase range, e.g., due to mismatching loading impedance, layout, etc.

Embodiments of the present disclosure provide a circuit for adjusting or calibrating the phase difference so that it has a desired value. According to one embodiment, the circuit includes a RC-CR circuit and a calibration circuit. The RC-CR circuit outputs a first signal at a first output node over a RC path, and outputs a second signal at a second output node over a CR path. The calibration circuit is coupled to the RC-CR circuit at the first output node over the RC path. The calibration circuit includes an array of capacitors and a plurality of switches, and each of the array of capacitors is connected, in series, to a corresponding switch in the plurality of switches. Each of the array of capacitors and its corresponding switch are coupled between the first output node and a ground. Each of the plurality of switches may be switched on or off such that the first signal and the second signal have a phase difference that falls within a predetermined phase range. The circuit may be used in measurement receivers for signal measurement.

Measurement receivers have been known for measuring characteristics of radio signals, such as signal strength and quality including leakage, image and linearity, etc. Generally, measurements of the characteristics may be used to perform calibrations, e.g., calibrations in factory, laboratory calibrations, or calibrations in live mode, of radio signals of a wireless communication system, or processing methods used in a wireless communication system. For example, a measurement receiver may be used to perform factory transmitter automatic power control (Tx APC) calibration, factory transmitter/measurement receiver (Tx/MRx) local oscillator leakage and frequency dependent (FD) I/Q image calibration, factory Tx counter $3^{rd}$-order intermodulation products (Tx 8-phase CIM3) calibration, live mode transmission power detection for top output powers (e.g., power delivered from a power amplifier to an antenna), live digital pre-distortion (DPD) for top output powers, live mode antenna tuning for top output powers, and live mode FD I/Q image calibration.

In one example, a measurement receiver may be used for factory or live mode FD I/Q image calibration for signals transmitted over an in-phase (I) path and a quadrature (Q) path of a transmitter. I/Q transmitters typically suffer from image distortion due to gain and phase imbalances between I path and Q path. The imbalances may be measured using a measurement receiver, and correction of image distortion may then be performed based on the measurements.

Figure 1:
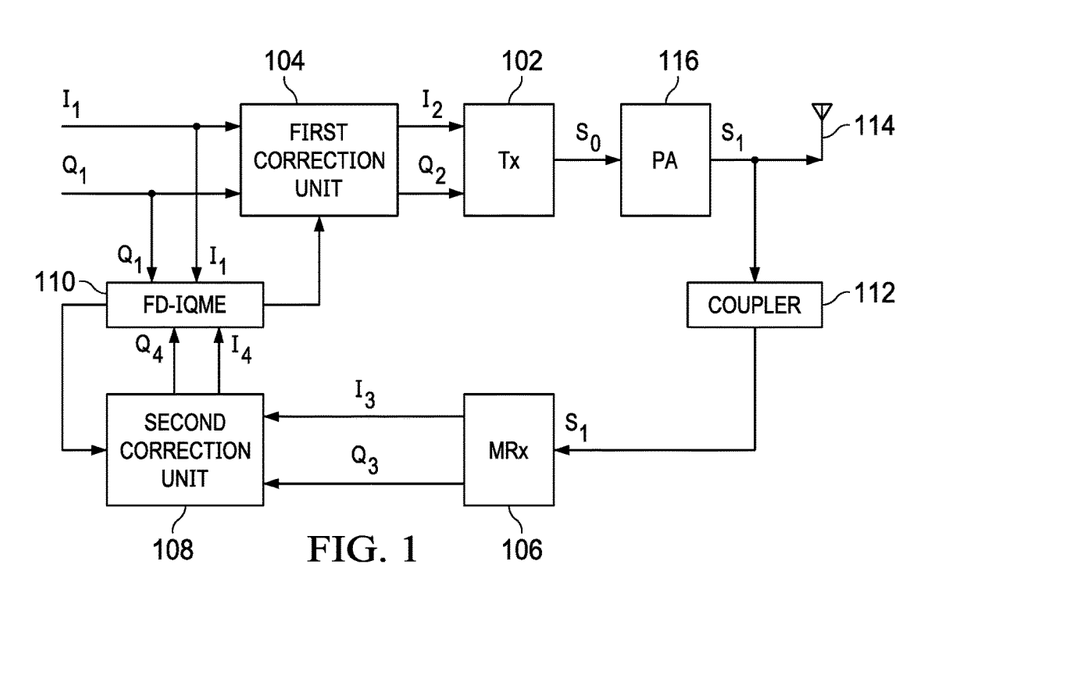
FIG. 1 illustrates a diagram of an embodiment wireless communication system.

FIG. 1 illustrates a diagram of an embodiment communication system 100. The communication system 100 includes a transmitter (Tx) 102, a first correction unit 104, a measurement receiver (MRx) 106, a second correction unit 108, a frequency dependent I/Q mismatch estimation (FD-IQME) unit 110, a coupler 112, an antenna 114 and a power amplifier (PA) 116. The transmitter 102 may be a linear I/Q transmitter. The first correction unit 104 receives baseband signals over I/Q path, i.e., I1 and Q1, and receives correction signals from the FD-IQME unit 110. For example, the first correction unit 104 may cancel out frequency dependent image distortion of signals that are output from the transmitter 102 or PA 116. The first correction unit 104 then outputs corrected I/Q path signals, i.e., I2, Q2. The first correction unit 104 may include a baseband digital processor, e.g., an application specific integrated circuit (ASIC) or a field-programmable gate array (FPGA), that may digitally implement Tx frequency-dependent image correction. The transmitter 102 receives and processes I2 and Q2, and generates a transmission signal S0 that is suitable for transmission. The PA 116 receives the signal S0 and outputs a signal S1 that is transmitted via the antenna 114. The transmission signal S1 is also fed into the MRx 106 through the coupler 112. The signal S0 may also be fed directly into the MRx 106 (not shown) for measurement. The MRx 106 measures the transmission signal S0/S1 and outputs signals I3 and Q3 over the I/Q path. The second correction unit 108 receives I3 and Q3, and performs distortion correction on I3 and Q3 based on a control signal from the FD-IQME 110. Signal distortions of I3 and Q3 may be caused by the transmitter 102. The second correction unit 108 outputs I4 and Q4 and feeds them into the FD-IQME 110. The second correction unit 108 may include a baseband digital processor (e.g., an ASIC or a FPGA) that may digitally implement MRx frequency-dependent image correction. The FD-IQME 110 receives I1, Q1 and I4, Q4, performs estimation of signal distortion of the signals output from the transmitter 102 and/or the PA 116 based on I4, Q4, and outputs the control signals for the first correction unit 104 and the second correction unit 108 to perform distortion correction accordingly. The FD-IQME 110 may include a baseband digital processor (e.g., an ASIC or FPGA, or even a firmware) that may implement frequency-dependent I/Q mismatch estimation for generating Tx and MRx frequency-dependent correction signals.

Figure 2:
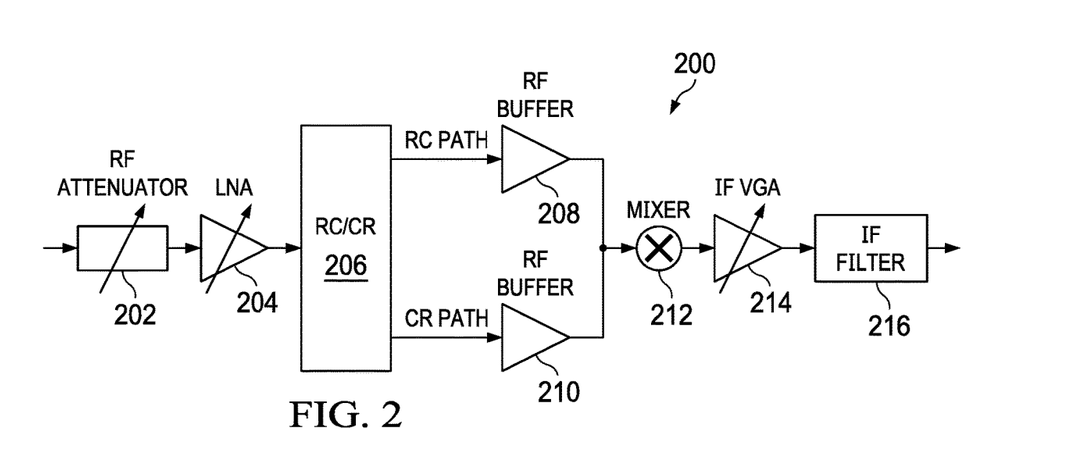
FIG. 2 illustrates a diagram of an embodiment measurement receiver.

FIG. 2 illustrates a diagram of an embodiment circuit 200 of an MRx. The circuit 200 may be used in the MRx 106 of the communication system 100 illustrated in FIG. 1. The circuit 200 includes a radio frequency (RF) attenuator 202, a low noise amplifier (LNA) 204, a RC-CR circuit 206, RF buffers 208, 210, a mixer 212, an intermediate frequency (IF) variable gain amplifier (VGA) 214, and an IF filter 216. The RF attenuator 202 attenuates a received RF signal and feeds an output signal to the LNA 204. The LNA 204 receives and amplifies the output signal from the RF attenuator 202, thereby generating an amplified signal. In one example, in a case where the received RF signal is high in strength, the received RF signal may be attenuated by the RF attenuator 202 and fed into the RC-CR circuit 206, bypassing the LNA 204. In another example, in a case where the received RF signal is small in strength, the received RF signal may be fed to the LNA 204 for amplification, bypassing the RF attenuator 202. The RC-CR circuit 206 receives and phase-shifts the amplified signal and outputs a first signal on a RC path, and outputs a second signal on a CR path. The two signals (i.e., the first signal and the second signal) have a phase shift of a predefined value. The two signals are passed to the RF buffers 208, 210, respectively, and then passed to the mixer 212. The mixer 212 may output a signal that has an intermediate frequency for subsequent processing. For example, as shown, the signal output by the mixer 212 may be amplified by the IF VGA 214, and filtered by the IF filter 216, which generates a filtered IF signal.

The RC-CR circuit 206 may also be referred to as a phase shift circuit or a RC-CR network. A RC-CR circuit is used to phase-shift an input signal, and to generate two output signals having a phase difference of a designed phase value. In this example, the RC-CR circuit 206 is configured such that the two output signals have a phase difference that equals 90 degree. However, due to processing variation, loading impedance (e.g., caused by load and parasitic effect), the phase difference may not be exactly equal to the predefined phase. For example, the phase difference may fall within of a phase range of the predefined phase, i.e., {P−Δ, P+Δ}, where P represents the predefined phase, e.g., 90°, and Δ represents a maximum phase error that the phase difference is allowed. For example, the phase difference may fall within a phase range of {90°−0.5°, 90°−0.5°}, or {90°−0.03°, 90°+0.03}. Generally, the closer the phase difference is to the predefined phase, the higher the RC-CR phase accuracy of a RC-CR circuit is. In one example, when a phase difference of a RC-CR circuit falls within a predefined phase range, the RC-CR circuit may be deemed to produce an acceptable or accurate RC-CR phase shift. However, when the phase difference of the RC-CR circuit falls out of the predefined phase range, an RC-CR phase error occurs. The RC/CR phase accuracy of an MRx affects performance of the MRx, e.g., in factory or live mode FD I/Q image calibration of a cellular transmitter.

Figure 3:
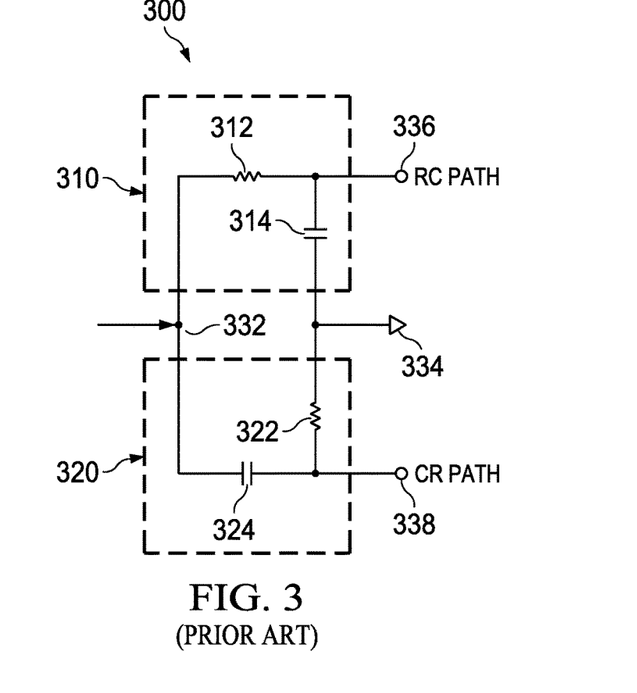
FIG. 3 illustrates a diagram of an embodiment RC-CR circuit.

FIG. 3 illustrates a diagram of an embodiment RC-CR circuit 300. The RC-CR circuit 300 is a conventional RC-CR circuit that phase-shifts an input signal to generate two output signals having a 90° phase difference. The RC-CR circuit 300 includes a RC circuit 310 and a CR circuit 320. The RC circuit 310 includes a resistor 312 and a capacitor 314. The resistor 312 and the capacitor 314 are connected in series, and are coupled between an input node 332 of the RC-CR circuit 330 and a ground 334. The CR circuit 320 includes a resistor 322 and a capacitor 324. The resistor 322 and the capacitor 324 are connected in series, and are coupled between the input node 332 and the ground 334. A common node of the resistor 312 and the capacitor 314 is coupled to a first output node 336 of the RC-CR circuit 300. The first output node 336 may be referred to as an output node on a RC path of the RC-CR circuit 300. A common node of the resistor 322 and the capacitor 324 is coupled to a second output node 338 of the RC-CR circuit 300. The second output node 338 may also be referred to as an output node on a CR path of the RC-CR circuit 300. The resistor 312 and the capacitor 314 in the RC circuit 310 may be referred to as a RC path resistor and a RC path capacitor, respectively, and the resistor 322 and the capacitor 324 in the CR circuit 320 may be referred to as a CR path resistor and a CR path capacitor, respectively. The RC-CR circuit 300 receives an input signal at the input node 332, and outputs a first signal at the first output node 336, and outputs a second signal at the second output node 338. The resistors 312, 322 314 and the capacitors 314, 324 are designed to have values such that the two signals (i.e., the first signal and the second signal) have a phase difference that is equal to 90 degree.

Figure 4:
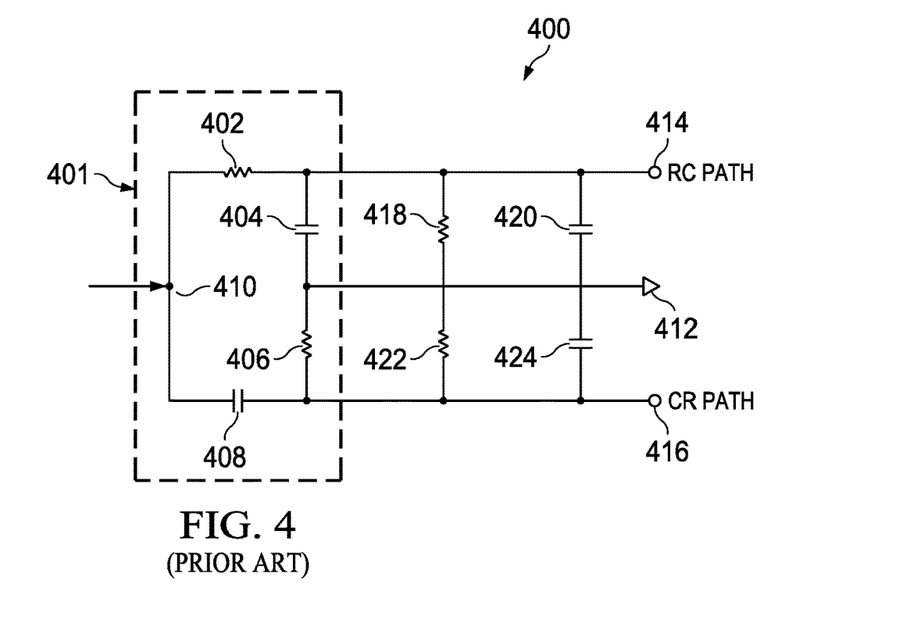
FIG. 4 illustrates a diagram of another embodiment RC-CR circuit.

FIG. 4 illustrates a diagram of an embodiment RC-CR circuit 400. FIG. 4 illustrates an equivalent RC-CR circuit that takes into consideration of circuitry loading and parasitic effect. As shown, the RC-CR circuit 400 includes a circuit 401 that is similar to the RC-CR circuit 300. The circuit 401 incudes resistors 402, 406, and capacitors 404, 408. The resistor 402 (i.e., RC path resistor) and the capacitor 404 (i.e., RC path capacitor) are connected in series and coupled between an input node 410 of the RC-CR circuit 400 and a ground 412. The resistor 406 (i.e., CR path resistor) and the capacitor 408 (i.e., CR path capacitor) are connected in series and coupled between the input node 410 of the RC-CR circuit 400 and the ground 412. A common node of the resistor 402 and the capacitor 404 is connected to a first output node 414 on a RC path, and a common node of the resistor 406 and the capacitor 408 is connected to a second output node 416 on a CR path. The RC-CR circuit 400 generates two output signals at the first and the second output nodes 414, 416, respectively, and the two output signals have a phase difference of a predefined phase.

The RC-CR circuit 400 also includes resistors 418, 422, and capacitors 420, 424. The resistor 418 and the capacitor 420 are connected in parallel and coupled between the first output node 414 and the ground 412. The resistor 422 and the capacitor 424 are connected in parallel and coupled between the second output node 416 and the ground 412. The resistors 418, 422 and the capacitors 420, 424 represent loading and parasitic impedances on the RC path and the CR path, respectively.

In one example, the resistors 402, 406 may have the same resistance, e.g., represented by R, the capacitors 404, 408 may have the same capacitance, e.g., represented by C, and the circuit 401 is designed to generate the two output signals having a phase difference of 90°. In this case, when the resistors 418, 422 have the same resistance Rp, and the capacitors 420, 424 have the same capacitance Cp, the two output signals at the first output node 414 and the second output node 416 may have phases $\theta_{RC}$ and $\theta_{CR}$ that are represented, respectively, by:

$$\theta_{RC} = \tan^{-1}\left(-\frac{\omega(C+C_p)R_pR}{R_p+R}\right)$$

$$\theta_{CR} = \tan^{-1}\left(\frac{R_p+R}{\omega(C+C_p)R_pR}\right)$$

That is, the two output signals have a phase difference equal to 90°. This indicates that when the loading impedance on the RC path and the CR path match (i.e., the same), the RC-CR circuit 400 receives an input signal at the input node 410, and outputs two signals with a phase difference of 90°. The phase of the output signal at the first output node 414 may be referred to as a RC phase, and the phase of the output signal at the second output node 416 may be referred to as a CR phase. Thus, the RC-CR phase difference is 90°.

However, in reality, the RC and CR network as well as the loading impedance on the RC path and the CR path generally do not match each other, which causes the RC-CR phase difference of the output signals to deviate from the predefined 90° (consequently resulting in RC-CR phase error or deviation), and reduces the RC-CR phase accuracy. Low RC-CR phase accuracy consequently reduces measurement and calibration performance of a MRx. Mismatch of a RC-CR network as well as loading impedance between the RC path and the CR path of the RC-CR network may be resulted from various factors, such as processing variations of circuits (e.g., circuits connected to the RC-CR circuit for signal processing), and/or circuit layout, which involves uncontrollable layout behavior, such as wiring, coupling, spacing, positioning, etc. It is a challenging task to design for a near-constant phase difference over a wide frequency range covering multiple bands, e.g., 600 MHz to 6 GHz, especially for high frequency, e.g., 6 GHz.

Figure 5:
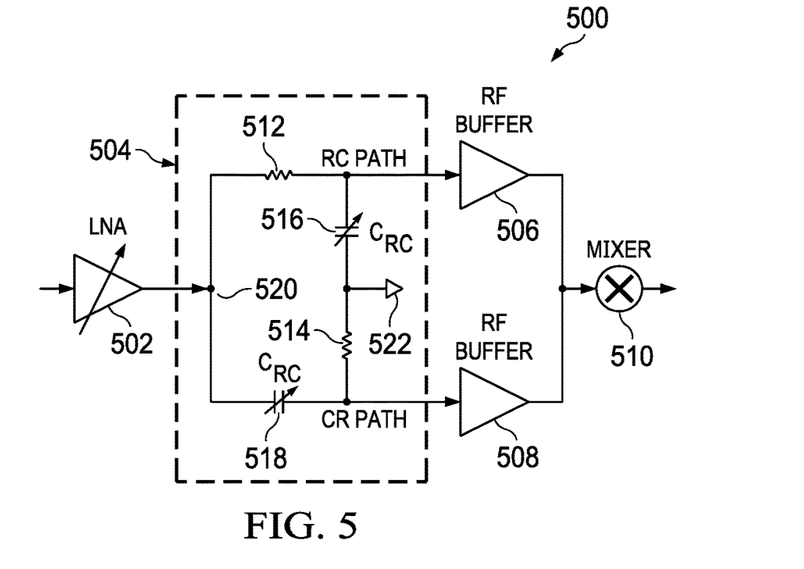
FIG. 5 illustrates a diagram of an embodiment circuit including a RC-CR circuit.

Methods and mechanisms have been proposed and utilized to improve RC-CR phase accuracy of a RC-CR circuit, e.g., by reducing impedance and/or capacitance mismatch between the RC path and the CR path. FIG. 5 illustrates a diagram of a circuit 500. The circuit 500 includes a LNA 502, a RC-CR circuit 504, RF buffers 506, 508, and a mixer 510. The LNA amplifies a received signal and feeds into the RC-CR circuit 504. The RC-CR circuit 504 generates two output signals having a phase difference of a predefined value. The two output signals are then passed to the RF buffers 506, 508, respectively, and passed to the mixer 510. The RC-CR circuit 504 is configured to reduce RC-CR phase error by adjusting RC path and the CR path capacitors. The RC-CR circuit 504 includes resistors 512, 514, and capacitors 516, 518. The resistor 512 and the capacitor 516 are connected in series and coupled between an input node 520 of the RC-CR circuit 504 and a ground 522. The resistor 514 and the capacitor 518 are connected in series and coupled between the input node 520 and the ground 522. The RC path capacitor 516 and CR path capacitor 518 are each adjustable to have different capacitances in order to reduce layout parasitic mismatch, and thus reduce capacitance mismatch between the RC path and the CR path.

Figure 6:
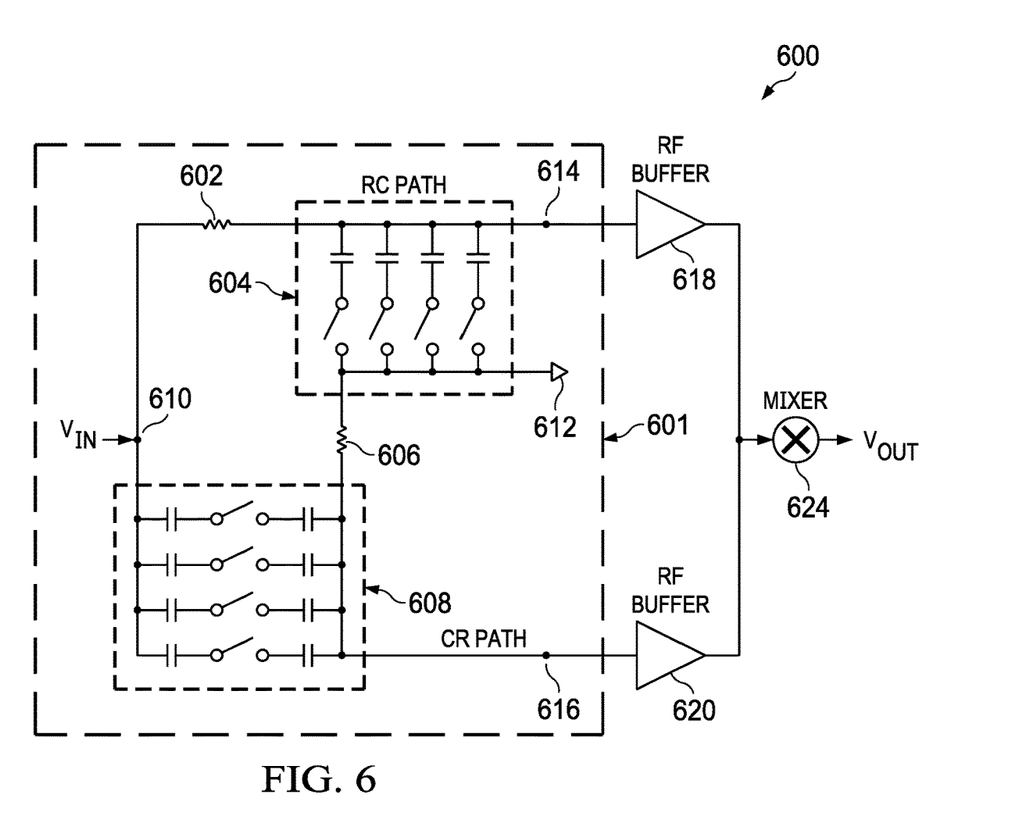
FIG. 6 illustrates a diagram of another embodiment circuit including a RC-CR circuit.

FIG. 6 illustrates a diagram of a circuit 600. As shown, the circuit 600 includes a RC-CR circuit 601. The RC-CR circuit 601 is configured to reduce RC-CR phase error by adjusting RC path and CR path capacitances. As shown, the RC-CR circuit 601 includes resistors 602, 606, a first array of capacitors 604 and a second array of capacitors 608. The resistor 602 and the first array of capacitors 604 are connected in series and are coupled between an input node 610 that receives an input signal $V_{in}$ and a ground 612. The first array of capacitors 604 is equivalent to the RC path capacitor of the RC-CR circuit 601. The resistor 606 and the second array of capacitors 608 are connected in series and are coupled between the input node 610 and the ground 612. The second array of capacitors 608 is equivalent to the CR path capacitor of the RC-CR circuit 601. The first array of capacitors 604 includes a plurality of capacitors connected in parallel. Each of the plurality of capacitors is coupled to the ground 612 through a switch. By switching on or off the switches, the first array of capacitors 604 may have difference capacitances. The second array of capacitors 608 includes a plurality of branches connected in parallel. Each branch includes two capacitors connected in series through a switch. By switching on or off these switches, the second array of capacitors 608 may also have difference capacitances. A common node of the resistor 602 and the first array of capacitors 604 is connected to an output node 614 on a RC path, and a first output signal is output from the output node 614. A common node of the resistor 606 and the second array of capacitors 608 is connected to an output node 616 on a CR path, and a second output signal is output from the output node 616. The first signal and the second signal are then fed into RF buffer 618, 620, respectively, and subsequently passed to a mixer 624 which outputs a signal $V_{out}$. In this example, both the RC path capacitor (represented by the first array of capacitors 604) and the CR path capacitor (represented by the second array of capacitors 608) are adjustable using the switches in the first array of capacitors 604 and the second array of capacitors 608, so as to reduce parasitic mismatch between the RC path and the CR path.

The circuits 500 and 600 as illustrated in FIGS. 5 and 6 both modify the conventional RC-CR circuit (as shown in FIG. 3) by utilizing adjustable (instead of fixed) RC path and CR path capacitors, and attempt to adjust both the RC path and CR path capacitances in order to reduce processing and parasitic mismatch. This relatively complicates capacitance matching between the RC path and the CR path. Further, as described above, the second array of capacitors 608 in the circuit 600 includes branches connected in parallel, and each branch includes two capacitors connected in series through a switch. Utilizing two capacitors connected in series through a switch in each branch also complicates matching of the CR path capacitance to the RC path capacitance. In addition, the drains and sources of the switches in the first array of capacitors 604 (i.e., on the RC path) have different potentials than those of the switches in the second array of capacitors 608 (i.e., on the CR path), and the potential differences between the switches on the RC path and CR path may result in extra RC-CR phase errors.

Figure 7:
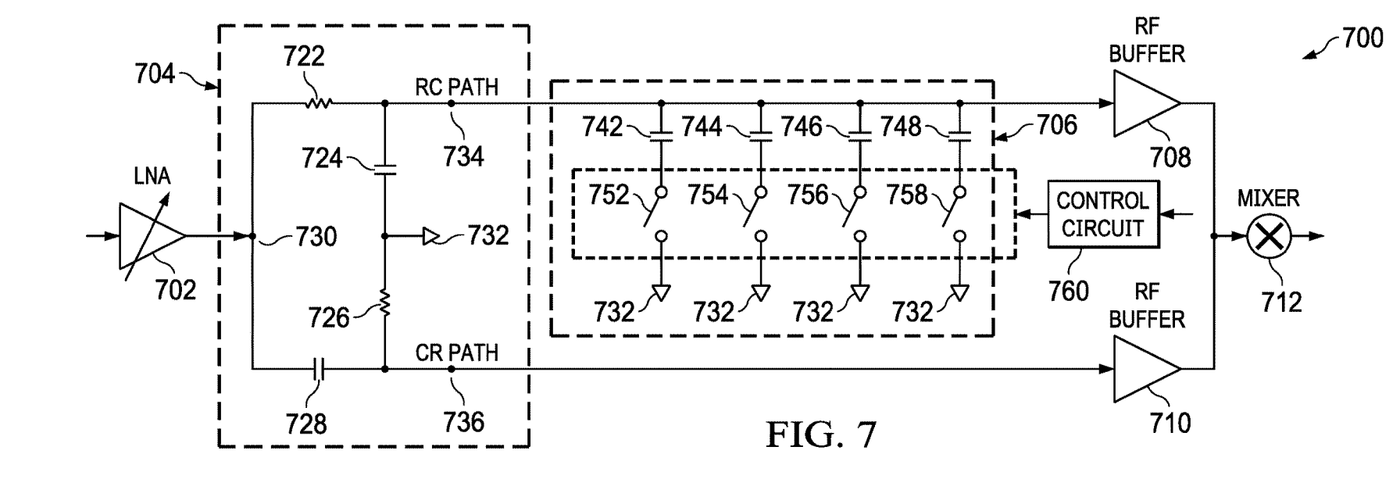
FIG. 7 illustrates a diagram of yet another embodiment circuit including a RC-CR circuit.

FIG. 7 illustrates a diagram of an embodiment circuit 700. The circuit 700 may be included in an MRx, e.g., the MRx 106 illustrated in FIG. 1. As shown, the circuit 700 includes a LNA 702, a RC-CR circuit 704, a RC-CR phase error calibration circuit 706, RF buffers 708, 710, and a mixer 712. The LNA 702 amplifies a received signal and feeds an output signal to the RC-CR circuit 704. The RC-CR circuit 704 receives an input signal at an input node 730, phase-shifts the input signal, and outputs a first signal on the RC path and outputs a second signal on the CR path of the RC-CR circuit 704. The two signals (i.e., the first signal and the second signal) have a predefined phase difference, e.g., 90°. The RC-CR phase error calibration circuit 706 is connected to the RC-CR circuit 704 along the RC path of the RC-CR circuit 704, and is configured to calibrate RC-CR phase errors of the RC-CR circuit 704. The two signals output by the RC-CR circuit 704 are passed to the RF buffers 708 and 710 and feed into the mixer 712.

The RC-CR circuit 704 is similar to the RC-CR circuit 300 as illustrated in FIG. 3. As shown, the RC-CR circuit 704 includes a RC circuit that has a resistor 722 and a capacitor 724. The resistor 722 and the capacitor 724 are connected in series, and are coupled between the input node 730 and a ground 732 of the circuit 700. The RC-CR circuit 704 also includes a CR circuit that has a resistor 726 and a capacitor 728. The resistor 726 and the capacitor 728 are connected in series, and are coupled between the input node 730 and the ground 732. A common node of the resistor 722 and the capacitor 724 is coupled to a first output node 734 of the RC-CR circuit 704. A common node of the resistor 726 and the capacitor 728 is coupled to a second output node 736 of the RC-CR circuit 704. Each of the resistors 722, 726 has a fixed resistance, and each of the capacitors 724, 728 has a fixed capacitance. The RC-CR circuit 704 may be configured so that a first signal output at the first output node 734 and a second signal output at the second output node 736 have a phase difference of a predefined phase value. The resistors 722, 726 may have the same resistance. The capacitors 724, 728 may have the same or different capacitances. The circuit 700 or the RC-CR circuit 704 may be manufactured using a 16 nm Fin Field-effect transistor (FinFET) manufacturing technology of Taiwan Semiconductor Manufacturing Company Limited (hereinafter "TSMC 16 nm FinFET manufacturing technology"). The TSMC 16 nm FinFET manufacturing technology is a technology that is used by TSMC for producing chips.

The RC-CR phase error calibration circuit 706 is connected to the RC-CR circuit 704 at the first output node 734 on the RC path. The RC-CR phase error calibration circuit 706 includes a plurality of capacitors, i.e., capacitors 742, 744, 746, 748, that are coupled in parallel. The RC-CR phase error calibration circuit 706 also includes a plurality of switches, i.e., switches 752, 754, 756, 758. The capacitors 742, 744, 746, 748 are coupled to the ground 732 through the switches 752, 754, 756, 758, respectively. Each of the capacitors 742, 744, 746, 748 corresponds to a switch 752, 754, 756 or 758. A first terminal of each of the capacitors 742, 744, 746, 748 is connected to the first output node 734 of the RC-CR circuit 704, and a second terminal of each of the capacitors 742, 744, 746, 748 is connected to its corresponding switch, i.e., 752, 754, 756, 758. That is, each of the capacitors 742, 744, 746, 748 and its corresponding switches 752, 754, 756, 758 are coupled between the first output node 734 and the ground 732, respectively. The switches 752, 754, 756, 758 may be n-channel metal-oxide-semiconductor field-effect transistor (NMOS) switches. By switching on or off each of the switches 752, 754, 756, 758, the RC-CR phase error calibration circuit 706 may load different capacitances on the RC path of the RC-CR circuit 704, and consequently changes the capacitance on the RC path of the RC-CR circuit 704. As a result, the phase difference between the first signal and the second signal output at the first output node 734 and the second output 736 may be adjusted. In this example, the RC path capacitance of the RC-CR circuit 704 is adjusted using the RC-CR phase error calibration circuit 706. The RC-CR phase error calibration circuit 706 calibrates the phase difference between the two signals output by the RC-CR circuit 704 so that the phase difference is equal to 90° or falls within a predefined phase range.

Although FIG. 7 illustrates four capacitors included in the RC-CR phase error calibration circuit 706, one of ordinary skill in the art would recognize that any number of capacitors applicable may be included in the RC-CR phase error calibration circuit 706. For example, the RC-CR phase error calibration circuit 706 may include 3, 6, or 8 capacitors connected in parallel. In another example, the number of capacitors included in the RC-CR phase error calibration circuit 706 may be equal to $2^n$, where n is an integer greater than 1. As an example, the RC-CR phase error calibration circuit 706 may include 2, 4, 8, 16 or 32 capacitors. Each capacitor corresponds to a switch, and each capacitor is connected to the ground through its corresponding switch. The number of capacitors included in the RC-CR phase error calibration circuit 706 may be determined based on RC-CR phase accuracy requirements.

Some or all of the capacitors 742, 744, 746, 748 may have the same capacitance or different capacitances. For example, the capacitors 742, 744, 746 may have the same capacitance that is different than the capacitor 748. In another example, one of the capacitors 742, 744, 746, 748 may have a capacitance that is equal to the capacitance of the capacitor 724. In yet another example, one of the capacitors 742, 744, 746, 748 may have a capacitance that is equal to a fraction of the capacitance of the capacitor 724 or the capacitor 728. In one embodiment, each of the capacitors 742, 744, 746, 748 may have a capacitance that is equal to a predefined value weighted by a weighting factor. For example, the capacitors 742, 744, 746, 748 may have capacitances of $a_1*x$, $a_2*x$, $a_3*x$ and $a_4*x$, respectively, where x is a predefined capacitance value, and $a_1$, $a_2$, $a_3$ and $a_4$ are weighting factors. In one example, the weighting factors of $a_1$, $a_2$, $a_3$ and $a_4$ may have values of 1, 2, 3 and 4, respectively. In a case where the RC-CR phase error calibration circuit 706 includes n capacitors C1, . . . , Ci, . . . , Cn connected in parallel, each of the n capacitors may have a capacitance of $a_i*x$, where i=1, 2, . . . , n, and x is a predefined capacitance value. In one example, $a_i$ may have a value of $2^{i-1}$. In another example, $a_i$ may have a value of $2^{-(i-1)}$. In the case where n capacitors of the RC-CR phase error calibration circuit 706 have capacitances of $2^{i-1}$ or $2^{-(i-1)}$, respectively, where i=1, 2, . . . , n, the n capacitors may be referred to as a binary weighted capacitor array or binary capacitor array.

The number of the capacitors included in the RC-CR phase error calibration circuit 706 and/or capacitances of the capacitors may be determined such that capacitance on the RC path of the RC-CR circuit 704 can be adjusted, and consequently, phase difference between the first signal and the second signal output at the first output node 734 and the second output 736 may be adjusted to equal to a predefined phase value, e.g., 90°, or to fall within a predefined phase range, e.g., {P−Δ, P+Δ}, where P represents the predefined phase, e.g., 90°, and Δ represents a maximum phase error that the phase difference is allowed. For example, Δ may have a value of 0.1°, 0.05°, 0.5°, 1°, etc. In one example, the smallest capacitance among the capacitors 742, 744, 746, 748 may be equal to a fraction of the capacitance of the capacitor 724, i.e., the RC path capacitor of the RC-CR circuit 704. The faction may be a predetermined value, such as 1/10, 1/20, 1/5, 1/30, etc. The fraction, consequently, the smallest capacitance among the array of capacitors, may be determined based on a resolution required for phase error correction of the RC-CR circuit. The resolution for phase error correction determines the smallest phase error that needs to be adjusted. A higher resolution for phase error correction may require a smaller fraction.

The circuit 700 may further include a control circuit 760, which outputs control signals to switch on and off one or more of the switches 752, 754, 756, 758. In one example, the control circuit 760 may output a control signal of four bits, and each bit corresponds to one of the switches, indicating whether to switch on or off the corresponding switch. For example, the control circuit 760 may output 1001, which instructs to switch on the switches 752 and 758, and switch off the switches 754 and 756. In this case, bit 1 represents switching on and bit 0 represents switching off. N bits may be used to control n switches. One of ordinary skill in the art would recognize many variations and alternatives used to switch on/off the switches. The control circuit 760 may determine the control signal based on an input signal from a phase error estimation unit, such as the FD-IQME 110 illustrated in FIG. 1. The phase error estimation unit may be configured to receive phases of the two output signals of the RC-CR circuit 704, determines phase difference between the two output signals, and estimate the phase difference error. The phase error estimation unit may also be configured to determine how much the phase difference needs to be and can be corrected, and based thereon, generate a signal switching the switches, and send the signal to the control circuit 760. In one example, the signal may indicate which switch is to be turned on or turned off.

Figure 8:
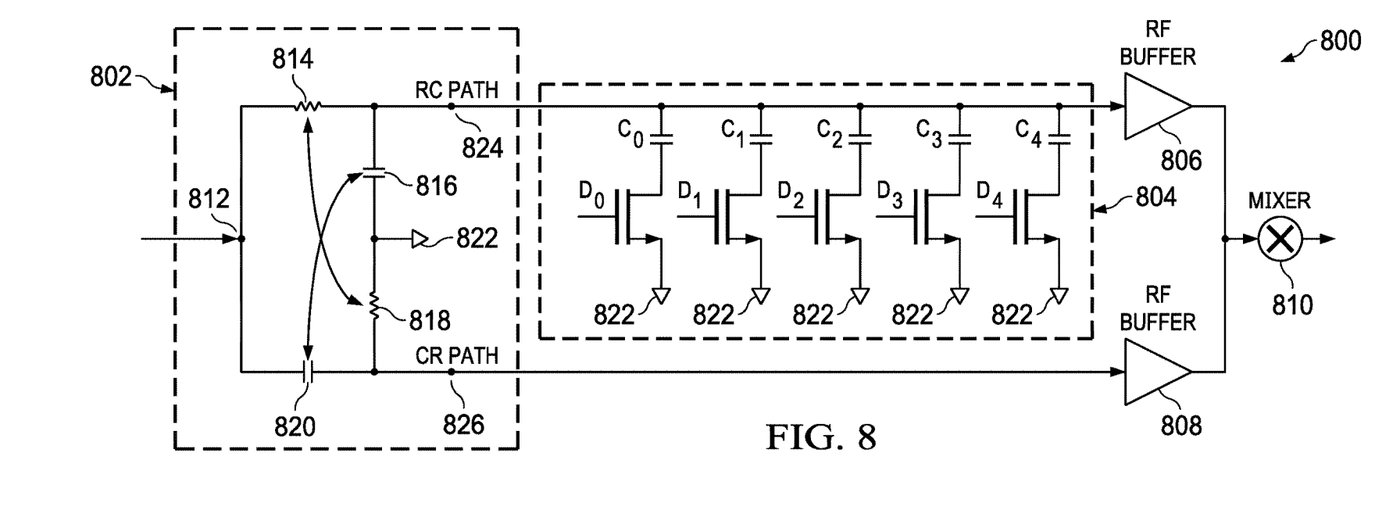
FIG. 8 illustrates a diagram of yet another embodiment circuit including a RC-CR circuit.

FIG. 8 illustrates a diagram of another embodiment circuit 800. The circuit 800 may also be included in an MRx. The circuit 800 includes a RC-CR circuit 802, a RC-CR phase error calibration circuit 804, RF buffers 806, 806, and a mixer 810. The RC-CR circuit 802 receives an input signal at an input node 812, phase-shifts the input signal, and outputs a first signal on the RC path of the RC-CR circuit 802, and outputs a second signal on the CR path of the RC-CR circuit 802. The RC-CR circuit 802 is designed for the two signals (i.e., the first signal and the second signal) to have a predefined phase difference, e.g., 90°. The RC-CR phase error calibration circuit 804 is connected to the RC-CR circuit 802 on the RC path of the RC-CR circuit 802, and is configured to calibrate RC-CR phase errors of the RC-CR circuit 802, so that the phase difference between the two signals output by the RC-CR circuit 802 equals a predefined value or falls within a predefined phase range. The two signals output by the RC-CR circuit 802 are passed to the RF buffers 806 and 808 and feed to the mixer 810.

The RC-CR circuit 802 is similar to the RC-CR circuit 300 as illustrated in FIG. 3. As shown, the RC-CR circuit 802 includes a resistor 814 and a capacitor 816 that are connected in series, and coupled between the input node 812 and a ground 822. The RC-CR circuit 802 also includes a resistor 818 and a capacitor 820 that are connected in series and coupled between the input node 812 and the ground 822. A common node of the resistor 814 and the capacitor 816 is coupled to a first output node 824 of the RC-CR circuit 802. A common node of the resistor 818 and the capacitor 820 is coupled to a second output node 826 of the RC-CR circuit 802. Each of the resistors 814, 818 has a fixed resistance, and each of the capacitors 816, 820 has a fixed capacitance. The circuit 800 and/or the RC-CR circuit 802 may be manufactured using the TSMC16 nm FinFET manufacturing technology.

The RC-CR phase error calibration circuit 804 is connected to the RC-CR circuit 802 at the first output node 824 along the RC path. The RC-CR phase error calibration circuit 804 is used to adjust the capacitance on the RC path of the RC-CR circuit 802, thereby adjusting or calibrating the phase difference between the two signals output by the RC-CR circuit 802. The RC-CR phase error calibration circuit 804 includes a plurality of capacitors, i.e., capacitors C0, C1, C2, C3, C4 and C5 that are coupled in parallel. Each of the capacitors C0, C1, C2, C3, C4 and C5 is coupled to the ground 822 through a corresponding switch, i.e., switches D0, D1, D2, D3, D4 and D5. A first terminal of each of the capacitors C0, C1, C2, C3, C4 and C5 is connected to the first output node 824, and a second terminal of each of the capacitors C0, C1, C2, C3, C4 and C5 is connected to its corresponding switch, i.e., D0, D1, D2, D3, D4 and D5. The switches D0, D1, D2, D3, D4 and D5 may be n-channel metal-oxide-semiconductor field-effect transistor (NMOS) switches. By switching on or off each of the switches D0, D1, D2, D3, D4 and D5, the RC-CR phase error calibration circuit 804 load different capacitances on the RC path, and consequently changes the capacitance on the RC path of the RC-CR circuit 802.

In one embodiment, the RC path resistance (the resistor 814) may be matched to the CR path resistance (the resistor 818) with respect to layout matching. For example, the resistors 814 and 818 may have the same resistance, and the layout on the RC path and the CR path also matches each other. The capacitor 820 may have a capacitance of 4x, the capacitor 816 may have a capacitance of 3x, and the capacitor D0 may have a capacitance of x, where x represents a capacitance value. That is, the capacitance of each of the capacitor 816 and 820 is a multiple of the capacitance of the capacitor D0. The CR path capacitance (4x of the capacitor 820) may be matched to the RC path capacitance (3x of capacitor 816+1x of the capacitor D0). Each of the capacitors Ci (i=0, 1, . . . , 4) has a capacitance of $2^{-i}x$. In one embodiment, the switch D0 may be turned on initially, so that the RC path capacitance matches the CR path capacitance. When the RC-CR phase error needs to be corrected, e.g., in a case when the phase difference between the two signals output at the output nodes 824 and 826 needs to be adjusted by increasing the RC path capacitance, one or more of the switches D1-D4 may be switched on. For example, D4 is turned on. In another example, D4 and D3 is turned on. In a case when the phase difference between the two signals output needs to be adjusted by decreasing the RC path capacitance, switch D0 may be switched off, and one or more of switches D1-D4 may be switched on. In this example, when switching on the switch D0 initially to match the RC path capacitance with the CR path capacitance, the "on" switch D0 may load resistance and parasitic capacitance to the RC-CR circuit 802, and thus may affect the RC-CR phase accuracy of the RC-CR circuit 802 initially. The effect of the loading resistance and parasitic capacitance caused by the "on" switch D0 may be reduced by use of the TSMC 16 nm FinFET processing technique.

Embodiments of the present disclosure, as show in FIGS. 7-8, correct or calibrate RC-CR phase error of a RC-CR circuit using a RC-CR phase error calibration circuit that is connected on the RC path of the RC-CR circuit. The RC-CR phase error calibration circuit adjusts the RC path capacitance of the RC-CR circuit, and thus adjusts the phase difference of signals that are output by the RC-CR circuit on the RC path and the CR path, respectively. The embodiments avoid adjusting the capacitors of the conventional RC-CR circuit, e.g., the RC-CR circuits 704, 802, thus keeping the conventional RC-CR circuit unchanged. The RC-CR phase error calibration circuit includes switches whose sources are coupled to the ground. Thus, smaller and simple NMOS switches may be used, and this simplifies the calibration circuit. Further, calibration resolution may be configurable by configuring the smallest capacitance among the capacitors in the RC-CR phase error calibration circuit. This results in more accurate calibration of the RC-CR phase error. The embodiments may operate on signals having various frequencies, such as frequencies in a range from 660 MHz to 6 GHz. The embodiments may be applied to various communications systems, such as communications systems compliant with 4G or 5G technologies.

Figure 9:
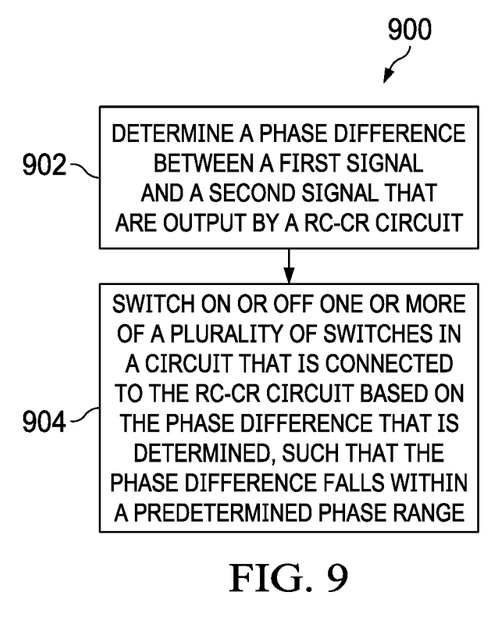
FIG. 9 illustrates a flowchart of an embodiment method for RC/CR phase error calibration.

FIG. 9 illustrates a flowchart of an embodiment method 900. As shown, at step 902, the method 900 determines a phase difference between a first signal and a second signal that are output by a RC-CR circuit. The RC-CR circuit is configured to phase-shift an input signal of the RC-CR circuit, output the first signal at a first output node of the RC-CR circuit and output the second signal at a second output node of the RC-CR circuit. At step 904, the method 900 switches on or off one or more of a plurality of switches in a circuit that is connected to the RC-CR circuit based on the phase difference that is determined, such that the phase difference falls within a predetermined phase range. The circuit is connected to the RC-CR circuit at the first output node of the RC-CR circuit and includes a plurality of capacitors and a plurality of switches. The plurality of capacitors are coupled in parallel, each of the plurality of capacitors is coupled, in series, to a corresponding switch in the plurality of switches, and each of the plurality of capacitors and its corresponding switch are coupled between the first output node of the RC-CR circuit and a ground.

Figure 10:
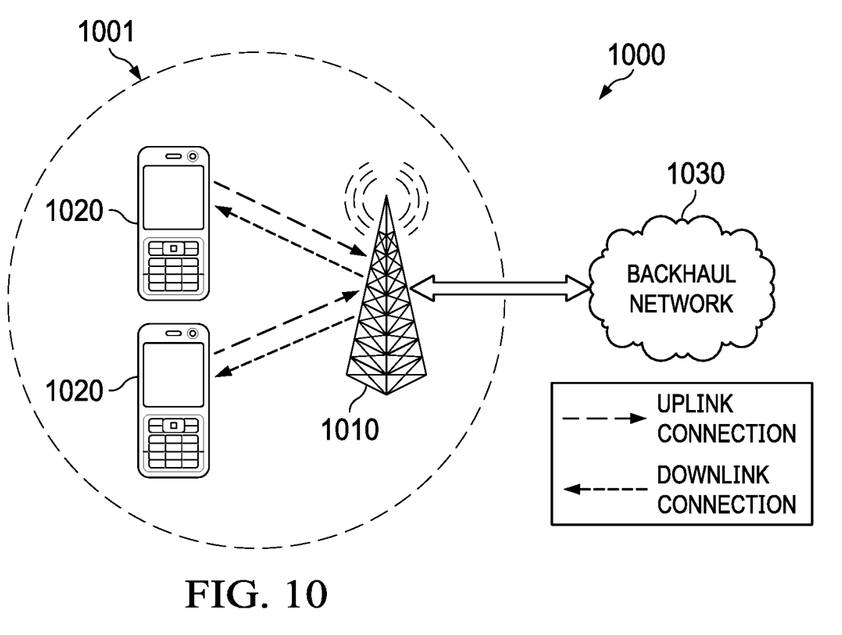
FIG. 10 illustrates a diagram of an embodiment wireless communication network.

FIG. 10 illustrates a network 1000 for communicating data. The network 1000 comprises a base station 1010 having a coverage area 1010, a plurality of mobile devices 1020, and a backhaul network 1030. As shown, the base station 1010 establishes uplink (dashed line) and/or downlink (dotted line) connections with the mobile devices 1020, which serve to carry data from the mobile devices 1020 to the base station 1010 and vice-versa. Data carried over the uplink/downlink connections may include data communicated between the mobile devices 1020, as well as data communicated to/from a remote-end (not shown) by way of the backhaul network 1030. As used herein, the term "base station" refers to any component (or collection of components) configured to provide wireless access to a network, such as an enhanced base station (eNB), a macro-cell, a femtocell, a Wi-Fi access point (AP), or other wirelessly enabled devices. Base stations may provide wireless access in accordance with one or more wireless communication protocols, e.g., long term evolution (LTE), LTE advanced (LTE-A), High Speed Packet Access (HSPA), Wi-Fi 802.11a/b/g/n/ac, etc. As used herein, the term "mobile device" refers to any component (or collection of components) capable of establishing a wireless connection with a base station, such as a user equipment (UE), a mobile station (STA), and other wirelessly enabled devices. In some embodiments, the network 1000 may comprise various other wireless devices, such as relays, low power nodes, etc. Embodiments of the present application may be applied in a mobile device that communicates with the network 1000.

Figure 11:
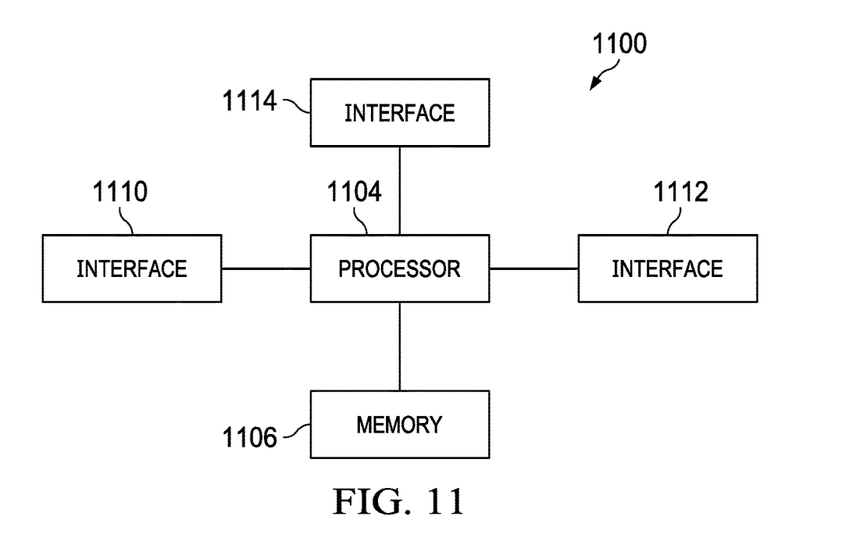
FIG. 11 illustrates a diagram of an embodiment processing system.

FIG. 11 illustrates a block diagram of an embodiment processing system 1100 for performing embodiments described herein, which may be installed in a host device. As shown, the processing system 1100 includes a processor 1104, a memory 1106, and interfaces 1110-1114, which may (or may not) be arranged as shown in FIG. 11. The processor 1104 may be any component or collection of components adapted to perform computations and/or other processing related tasks, and the memory 1106 may be any component or collection of components adapted to store programming and/or instructions for execution by the processor 1104. In an embodiment, the memory 1106 includes a non-transitory computer readable medium. The interfaces 1110, 1112, 1114 may be any component or collection of components that allow the processing system 1100 to communicate with other devices/components and/or a user. For example, one or more of the interfaces 1110, 1112, 1114 may be adapted to communicate data, control, or management messages from the processor 1104 to applications installed on the host device and/or a remote device. As another example, one or more of the interfaces 1110, 1112, 1114 may be adapted to allow a user or user device (e.g., personal computer (PC), etc.) to interact/communicate with the processing system 1100. The processing system 1100 may include additional components not depicted in FIG. 11, such as long term storage (e.g., non-volatile memory, etc.).

In some embodiments, the processing system 1100 is included in a network device that is accessing, or part otherwise of, a telecommunications network. In one example, the processing system 1100 is in a network-side device in a wireless or wireline telecommunications network, such as a base station, a relay station, a scheduler, a controller, a gateway, a router, an applications server, or any other device in the telecommunications network. In other embodiments, the processing system 1100 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

Figure 12:
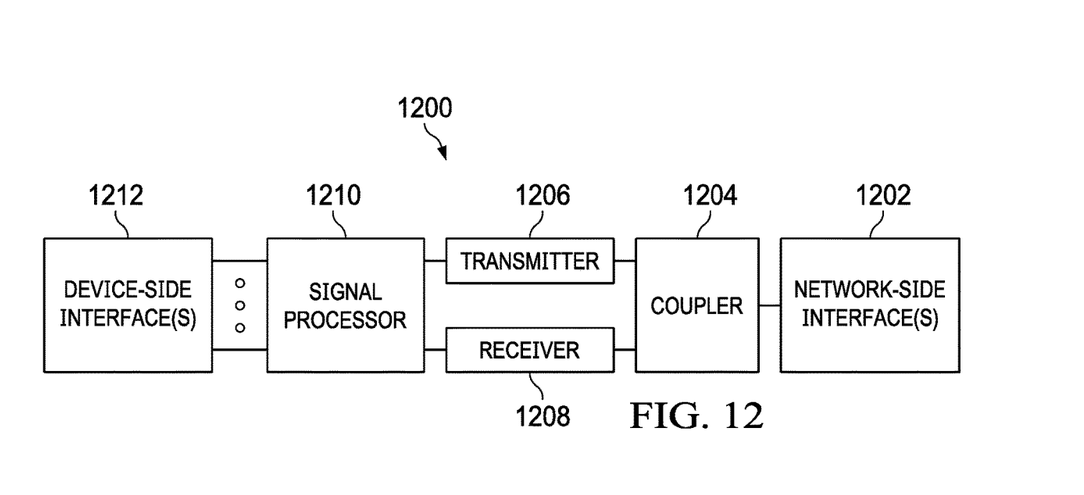
FIG. 12 illustrates a diagram of an embodiment transceiver.

In some embodiments, one or more of the interfaces 1110, 1112, 1114 connects the processing system 1100 to a transceiver adapted to transmit and receive signaling over the telecommunications network. FIG. 12 illustrates a block diagram of a transceiver 1200 adapted to transmit and receive signaling over a telecommunications network. The transceiver 1200 may be installed in a host device. As shown, the transceiver 1200 comprises a network-side interface 1202, a coupler 1204, a transmitter 1206, a receiver 1208, a signal processor 1210, and a device-side interface 1212. The network-side interface 1202 may include any component or collection of components adapted to transmit or receive signaling over a wireless or wireline telecommunications network. The coupler 1204 may include any component or collection of components adapted to facilitate bi-directional communication over the network-side interface 1202. The transmitter 1206 may include any component or collection of components (e.g., up-converter, power amplifier, etc.) adapted to convert a baseband signal into a modulated carrier signal suitable for transmission over the network-side interface 1202. The receiver 1208 may include any component or collection of components (e.g., down-converter, low noise amplifier, etc.) adapted to convert a carrier signal received over the network-side interface 1202 into a baseband signal. The signal processor 1210 may include any component or collection of components adapted to convert a baseband signal into a data signal suitable for communication over the device-side interface(s) 1212, or vice-versa. The device-side interface(s) 1212 may include any component or collection of components adapted to communicate data-signals between the signal processor 1210 and components within the host device (e.g., the processing system 1100, local area network (LAN) ports, etc.).

The transceiver 1200 may transmit and receive signaling over any type of communications medium. In some embodiments, the transceiver 1200 transmits and receives signaling over a wireless medium. For example, the transceiver 1200 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 1202 comprises one or more antenna/radiating elements. For example, the network-side interface 1202 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 1200 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by a controlling unit/module, an adjusting unit/ module, a determining unit/module, a switching unit/ module, a RC-CR phase error calibration unit/module, an image distortion correction unit/module, and/or a FD-IQME unit/module. The respective units/modules may be hardware, software, or a combination thereof. For instance, one or more of the units/modules may be an integrated circuit, such as field programmable gate arrays (FPGAs) or application-specific integrated circuits (ASICs).

Although the description has been described in detail, it should be understood that various changes, substitutions and alterations can be made without departing from the spirit and scope of this disclosure as defined by the appended claims. For example, the various elements or components may be combined or integrated in another system or certain features may be omitted, or not implemented Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:
1. A receiver circuit, comprising:
  a low noise amplifier (LNA) configured to produce an amplified radio frequency (RF) signal;
  a resistor-capacitor/capacitor-resistor (RC-CR) circuit coupled to receive the amplified RF signal to produce first and second phase-shifted signals;
  a phase calibration circuit coupled to receive the first phase-shifted signal to produce a phase calibrated signal;
  first and second RF buffers, wherein the first RF buffer is coupled to receive the phase calibrated signal and the second RF buffer is coupled to receive the second phase shifted signal;
  a mixer coupled to receive an output from each of the first and second RF buffers;
  an array of capacitors coupled in parallel and a plurality of selectable switches coupled to at least some of the array of capacitors, a first terminal of each of the array of capacitors is coupled to the first output node, and a second terminal of each of the array of capacitors is coupled to a ground of the circuit.
2. The receiver circuit of claim 1, wherein
  the RC-CR circuit comprises a first resistor and a first capacitor, a second resistor and a second capacitor; and
  wherein:
    the first resistor is coupled between the input node and the first output node;
    the first capacitor is coupled between the first output node and the ground;
    the second capacitor is coupled between the first input node and the second output node; and
    the second resistor is coupled between the second output node and the ground.
3. The receiver circuit of claim 2, wherein
  wherein the first and second capacitors have fixed capacitances.
4. The receiver circuit of claim 3, wherein
  wherein the first resistor and the second resistor have the same resistance.

5. The receiver circuit of claim 3, wherein
wherein the first capacitor and the second capacitor have the same capacitance.

6. A method by a receiver for receiving a radio frequency (RF) signal, comprising:
  receiving and amplifying the RF signal and outputting an input signal;
  receiving the input signal at an input of an RC-CR circuit that includes an RC path and a CR path;
  receiving, at a phase calibration circuit, an output of the RC path and producing a calibrated output to a first RF buffer;
  receiving an output the CR path at a second RF buffer;
  producing outputs of first and second RF buffers to a mixer; and
  producing control signals to the phase calibration circuit to selectively couple or decouple capacitors and or resistors from connectivity within the phase calibration circuit to adjust a phase of output of the RC path signal produced to the first RF buffer.

7. The method of claim 6 wherein the phase calibration circuit includes an array of capacitors coupled in parallel and a plurality of switches, a first terminal of each of the array of capacitors is coupled to the output of the RC path, and a second terminal of each of the array of capacitors is coupled to a ground of the circuit.

8. The method of the claim 7, wherein:
  the RC path comprises a first resistor and a first capacitor;
  the CR path comprises a second resistor and a second capacitor;
  wherein the first resistor coupled between the input node and the output of the RC path;
  wherein the first capacitor coupled between the output of the RC path and the ground;
  wherein the second capacitor coupled between the input node and the output of the CR path;
  wherein the second resistor coupled between the output of the CR path and the ground.

9. The method of the claim 8, wherein the first resistor and the second resistor have fixed capacitances, wherein the first capacitor and the second capacitor have fixed capacitances.

10. The method of the claim 9, wherein the first resistor and the second resistor have the same resistance, wherein the first capacitor and the second capacitor have the same capacitance.

* * * * *